US008761414B2

(12) United States Patent
Asada et al.

(10) Patent No.: US 8,761,414 B2
(45) Date of Patent: Jun. 24, 2014

(54) REPRODUCTION DEVICE AND REPRODUCTION METHOD

(75) Inventors: Kohei Asada, Kanagawa (JP); Tetsunori Itabashi, Kanagawa (JP); Yoshio Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 417 days.

(21) Appl. No.: 13/155,599

(22) Filed: Jun. 8, 2011

(65) Prior Publication Data

US 2011/0305349 A1 Dec. 15, 2011

(30) Foreign Application Priority Data

Jun. 15, 2010 (JP) ................................ 2010-136341

(51) Int. Cl.
*H03G 3/00* (2006.01)
*H04R 1/10* (2006.01)

(52) U.S. Cl.
USPC ............................................ 381/104; 381/74

(58) Field of Classification Search
USPC ........... 381/104-109, 74, 309, 55, 56, 57, 58, 381/122
See application file for complete search history.

(56) References Cited

U.S. PATENT DOCUMENTS

| | | | | |
|---|---|---|---|---|
| 7,961,895 | B2 * | 6/2011 | Wu et al. | 381/81 |
| 8,258,872 | B1 * | 9/2012 | Lazar et al. | 330/285 |
| 8,462,963 | B2 * | 6/2013 | Bongiovi et al. | 381/98 |
| 2006/0161282 | A1 * | 7/2006 | Chung | 700/94 |
| 2009/0315708 | A1 * | 12/2009 | Walley et al. | 340/540 |

FOREIGN PATENT DOCUMENTS

| | | | |
|---|---|---|---|
| JP | 2009-232205 | A | 10/2009 |
| JP | 2009232205 | A * | 10/2009 |

* cited by examiner

*Primary Examiner* — Vivian Chin
*Assistant Examiner* — Ammar Hamid
(74) *Attorney, Agent, or Firm* — Sony Corporation of America

(57) ABSTRACT

A reproduction device includes an information reading unit that reads sensitivity information from a storage unit of a headphone device which has a speaker reproducing an electric signal of an audible signal as a sound and the storage unit storing the sensitivity information for the speaker, an adjustment unit that adjusts an output level of the electric signal supplied to the headphone device, and a control unit that reads the sensitivity information from the storage unit via the information reading unit, and controls the adjustment unit such that the electric signal lies in an allowable maximal output level based on the sensitivity information.

13 Claims, 14 Drawing Sheets

REPRODUCTION DEVICE AND REPRODUCTION METHOD

BACKGROUND

The present disclosure relates to a reproduction device which delivers the maximum performance of a headphone device, keeps a sound pressure limitation, and supplies sound signals to the headphone device, and to a reproduction method.

In Japanese Unexamined Patent Application Publication No. 2009-232205, a technique is disclosed in which a reproduction sound pressure is not limited, but information for identifying a type of headphone device is maintained in a headphone device side so as to appropriately cancel noises in various types of headphone devices.

At present, regarding sound reproduction in a headphone device, the reproduction sound pressure is limited to a predetermined sound pressure due to hearing loss countermeasures. This regulates a maximal output voltage of an amplifier unit of the reproduction device main body and a maximal sensitivity of the headphone device (a maximal sound pressure which is obtained by performing a predetermined operation for a value obtained by measuring a headphone output when a predetermined signal is input to a headphone driver, using a so-called noise meter (which can measure a sound pressure level weighted with the frequency of the characteristic A)).

In other words, the maximal value of each of the amplifier output voltage and the headphone device sensitivity is defined, and adjustment is performed so as not to exceed the maximal value. That is to say, an amplifier with a characteristic of the "regulated maximal output amplifier output" and a headphone device with a characteristic of the "regulated maximal headphone sensitivity" are combined, and the output sound pressure is made to be within a predetermined sound pressure.

For example, in the headphone device, a resistor is connected in series to a speaker input unit thereof, thereby limiting the sound pressure.

Therefore, even if there are plural kinds of headphone devices and reproduction devices such as media players, respectively, there is no case where the headphone output sound pressure does not exceed the regulated sound pressure in any combination.

SUMMARY

However, even in a circumstance where the amplifier output voltage and the headphone sensitivity can be heightened through the improvement in technique by this measure, they are managed so as to be equal to or less than the regulated output voltage and the regulated sensitivity by adding the process for connecting a resistor in series or the like, due to the regulation.

However, in this case, as well as not being able to deliver the raw performances of the reproduction device and the headphone device, the resistor generates heat, which is not efficient in terms of power. The addition of the resistor also causes distortion and thus is not preferable in terms of performance.

For example, in a case of combination of an amplifier which can perform reproduction so as to be greater than the "regulated maximal amplifier output" by 10 dB but is suppressed to the "regulated maximal amplifier output" and a headphone device having a sensitivity characteristic lower than the "regulated maximal headphone sensitivity" by 10 dB because of not showing a performance up to the "regulated maximal headphone sensitivity", the reproduction can be performed only in the sound pressure lower than the regulated sound pressure by 10 dB.

In this case, if the amplifier shows completely the raw performance (performs reproduction so as to be greater than the "regulated maximal amplifier output" by 10 dB), the reproduction is possible in the limited sound pressure without exceeding the limited sound pressure. In other words, there are cases where the performance may not be delivered despite performing the high performance reproduction within the limited sound pressure.

It is desirable to provide a reproduction device which supplies sound signals (electrical signals) with appropriate levels according to types of headphone devices to be used, in a system which performs sound reproduction using the headphone devices.

A reproduction device according to an embodiment of the present disclosure includes an information reading unit that reads sensitivity information from a storage unit of a headphone device which has a speaker reproducing an electric signal of an audible signal as a sound and the storage unit storing the sensitivity information for the speaker, an adjustment unit that adjusts an output level of the electric signal supplied to the headphone device, and a control unit that reads the sensitivity information from the storage unit via the information reading unit, and controls the adjustment unit such that the electric signal lies in an allowable maximal output level based on the sensitivity information.

The adjustment unit may include a power amplifier that is a stage which outputs the electric signal to the headphone device; and a voltage switching unit that switches voltages supplied to the power amplifier. Here, the control unit may control the voltage switching unit to switch the supplied voltages based on the sensitivity information.

The information reading unit may include an L channel terminal, an R channel terminal, a ground terminal, and a power and control terminal as a connection unit with the headphone device; and a connection switching unit that performs connection switching for the L channel terminal and the R channel terminal between a terminal state for connecting the control unit to the storage unit of the headphone device and a terminal state for supplying the audible signal to the headphone device. Here, the control unit can communicate with the storage unit via the L channel terminal and the R channel terminal by switching the terminal states of the connection switching unit.

The adjustment unit may include an equalizer unit that processes the electric signal, a gain unit that performs a gain process for the electric signal, a limiter unit that performs a limiter process for the electric signal, or a compressor unit that processes the electric signal. In these cases, the control unit may control any one or plurality of the equalizer unit, the gain unit, the limiter unit, and the compressor unit such that the electric signal lies in an allowable maximal output level based on the sensitivity information.

In addition, when the storage unit of the headphone device can communicate wirelessly, the information reading unit may wirelessly communicate with the storage unit.

The sensitivity information may be information in an allowable range of sensitivity of the speaker.

A reproduction method according to another embodiment of the present disclosure includes reading sensitivity information from a storage unit of a headphone device which has a speaker reproducing an electric signal of an audible signal as a sound and the storage unit storing the sensitivity information for the speaker; and adjusting an output level of the electric signal such that the electric signal supplied to the headphone device lies in an allowable maximal output level based on the sensitivity information.

According to the present disclosure, it is possible for the reproduction device to automatically obtain information for sensitivity (sensitivity information) stored in the storage unit of the headphone device. In other words, it is possible to obtain information for sensitivity of the headphone device without a user's operation each time the headphone device is connected.

In addition, the electric signal supplied by the reproduction device is set to lie in an allowable maximal output level, based on the information for sensitivity of the headphone device obtained in this way. Therefore, the reproduction device side can automatically set an appropriate maximal output level corresponding to each headphone device which is used.

Here, examples of types of headphone devices include models of the headphone devices, characteristics of included audio components, and the like. Therefore, according to the present disclosure, it is possible to set a maximal output level corresponding to each model of a headphone device, or to set a maximal output level corresponding to each characteristic of an audio component even in the same model.

Further, according to the present disclosure, it is possible to read information for sensitivity stored in the storage unit of the headphone device using the L channel terminal and the R channel terminal. Therefore, it is possible to perform communication between the headphone device and the reproduction device using the connection unit in the related art as it is without changing the form of the connection unit.

According to the present disclosure, it is possible to automatically obtain storage information (sensitivity information) for each headphone device in the reproduction device without a user's operation. It is possible to perform reproduction while maintaining raw sound quality in a state of delivering raw performance of the headphone device by limiting the sound pressure based on the storage information of the headphone side obtained in this way.

That is to say, according to the present disclosure, it is possible to perform an appropriate sound pressure control for each headphone device which is used.

DETAILED DESCRIPTION OF EMBODIMENTS

Hereinafter, first to sixth embodiments of the present disclosure will be described sequentially.

First Embodiment

Figure 1:
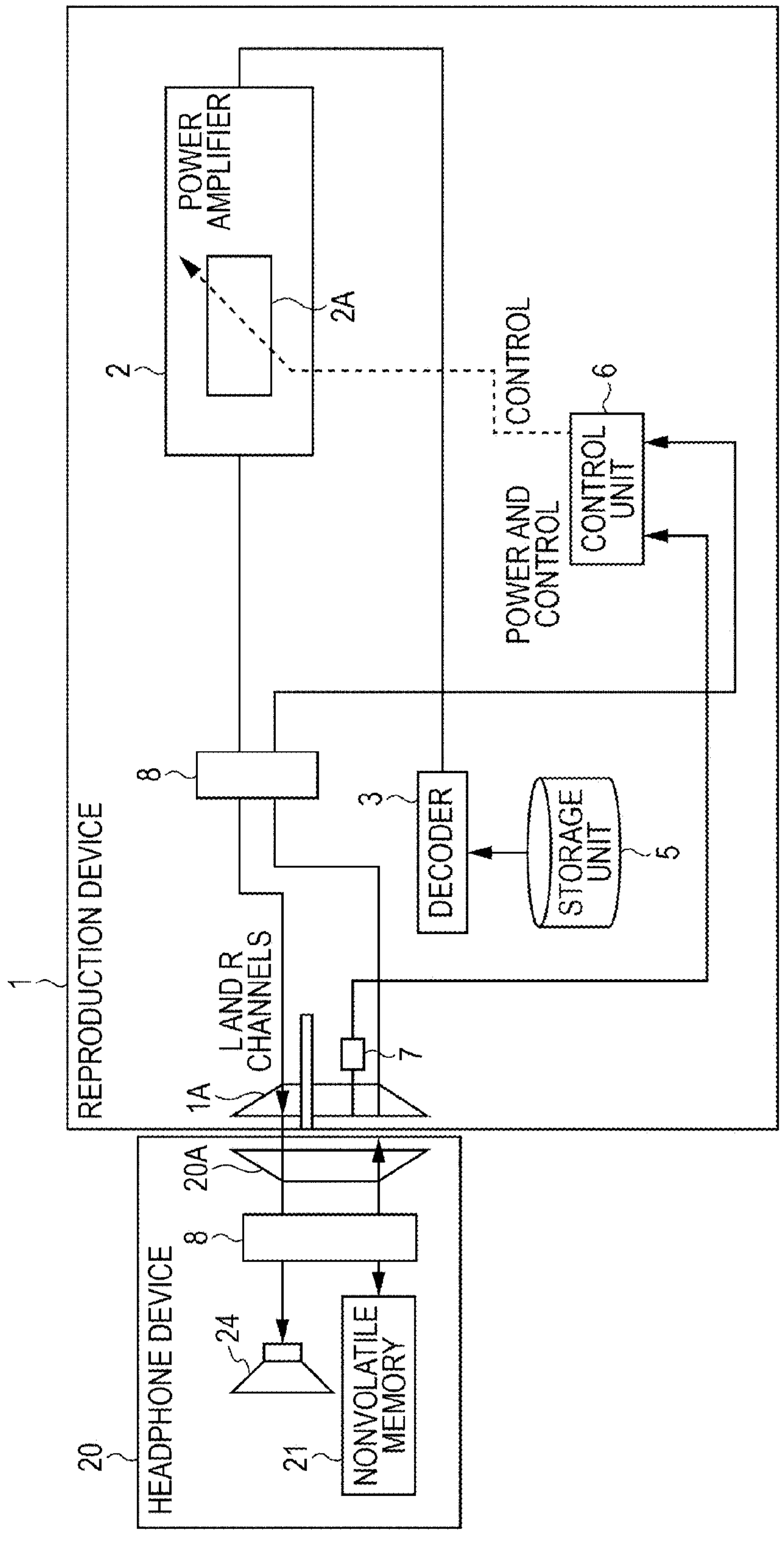
FIG. 1 is a block diagram illustrating a first embodiment of the present disclosure.

FIG. 1 is a diagram illustrating a first embodiment which is constituted by a reproduction device (an audio player device) 1 and a headphone device 20 as an embodiment of the present disclosure. This block diagram shows an internal configuration of the reproduction device 1 and an internal configuration of the headphone device 20, respectively.

In FIG. 1, the reproduction device 1 is configured to support various types of headphone devices as the headphone device 20 in the figure. Here, FIG. 8 shows types of the headphone devices 20 supported by the reproduction device 1 in this example.

Figure 8:
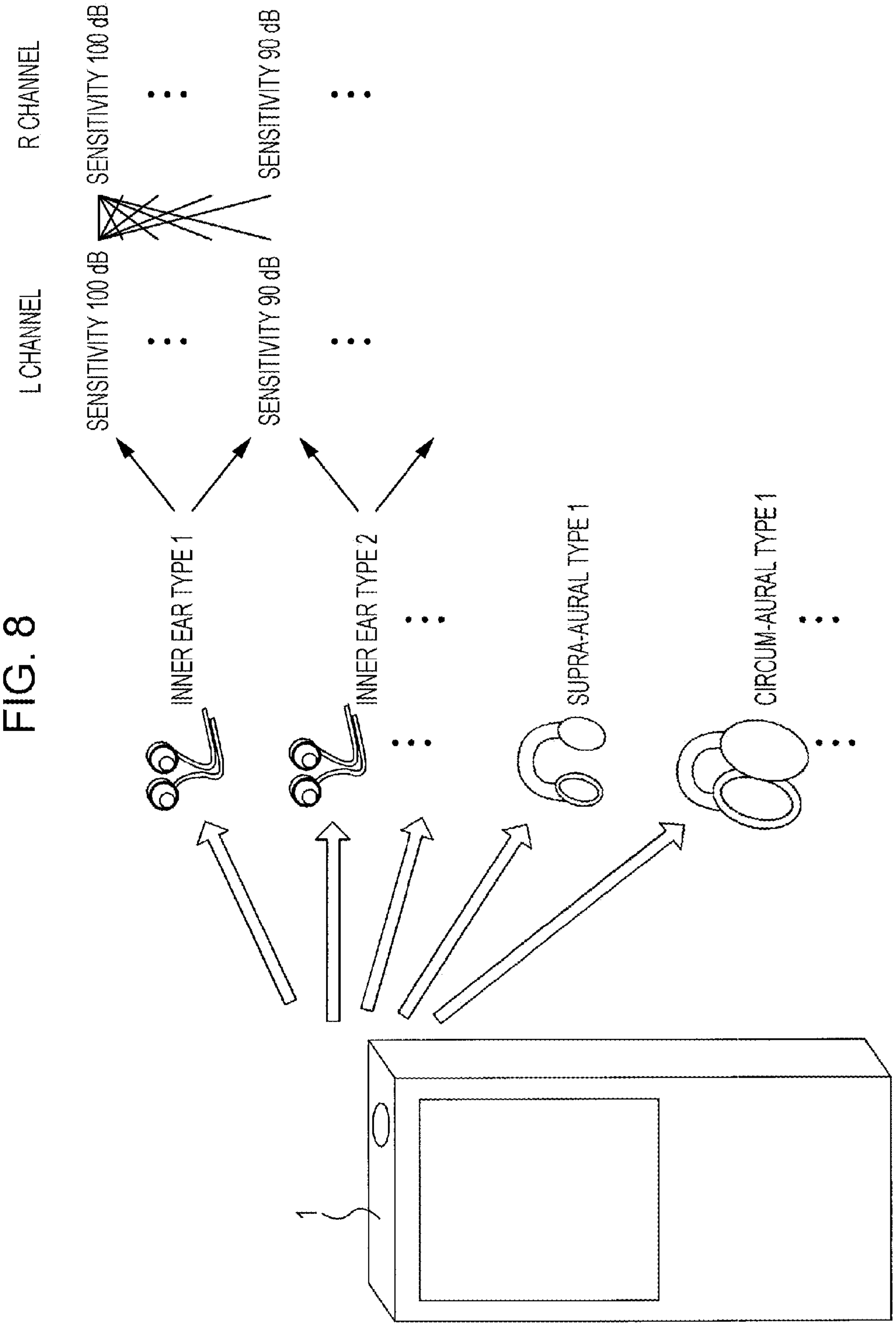
FIG. 8 is a diagram illustrating kinds of headphone devices.

As shown in FIG. 8, the reproduction device 1 in this example can be connected to headphone devices such as (1) an inner ear type headphone device, (2) a supra-aural type headphone device, (3) a circum-aural type headphone device.

The headphone devices have the predetermined sensitivities for each device as shown in the figure.

Referring to FIG. 1 again, the description will be continued.

First, the internal configuration of the headphone device 20 will be described.

The headphone device 20 includes a connection plug 20A, a speaker 24, a nonvolatile memory 21, and a connection switching unit 8.

The headphone device 20 can be installed in the reproduction device 1 by connecting the connection plug 20A to a connection jack 1A of the reproduction device 1 side.

The speaker 24 reproduces sound signals supplied from the reproduction device 1. The sound signals are supplied from the reproduction device 1 via L and R channel transmission paths.

The nonvolatile memory 21 stores information for sensitivity (hereinafter, referred to as "sensitivity information") of the headphone device 20. The sensitivity information can be read by a control unit 6 described later.

Figure 7:
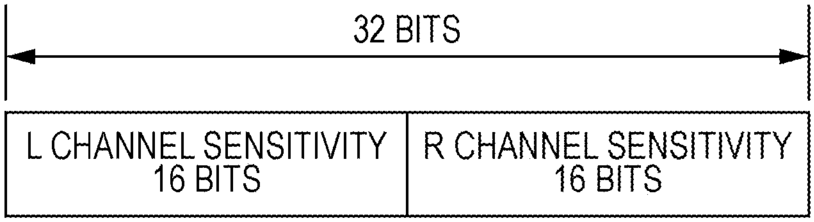
FIG. 7 is a diagram illustrating a format for sensitivity information according to the embodiment.

The sensitivity information is stored with a format shown in FIG. 7 as an example. In other words, 16 bits are allocated to the L channel and R channel. The numerical values are stored as absolute values. Thereby, each headphone device 20 can perform reproduction in the limited sound pressure.

Next, the internal configuration of the reproduction device 1 will be described. As shown in FIG. 1, the reproduction device 1 includes the connection jack 1A, a storage unit 5, a decoder 3, a power amplifier 2, a power-supply voltage switching unit 2A, a plug connection detecting unit 7, the control unit 6, and a connection switching unit 8.

The connection jack 1A is connected to the connection plug 20A of the headphone device 20 and forms the L and R channel transmission paths which supply sound signals to the speaker 24 of the headphone device 20.

The storage unit 5 may be used to store various kinds of data including sound signal data.

As a detailed configuration, the storage unit 5 may include, for example, a solid-state memory such as a flash memory, or, for example, an HDD (Hard Disk Drive).

In addition, the storage unit 5 may not include the embedded recording medium, but a drive device corresponding to a recording medium such as a portable recording medium, for example, a memory card embedding a solid-state memory therein, an optical disc such as a CD (Compact Disc) or a DVD (Digital Versatile Disc), a magneto-optical disc, a hologram memory, or the like.

Of course, both the embedded type memory such as a solid-state memory or an HDD and a drive device for a portable recording medium may be mounted.

The storage unit 5 writes and reads various kinds of data including audio data under the control of the control unit 6.

In the storage unit 5, for example, sound signal data is stored in a state of being compression-coded by a predetermined sound compression coding method.

The decoder 3 performs decompression for the compressed audio data read from the storage unit 5.

The power amplifier 2 amplifies sound signals output from the decoder 3 to have predetermined power.

The amplification stage of the power amplifier 2 may have a digital amplifier configuration or an analog amplifier configuration. The analog amplifier configuration performs D/A conversion for the output from the decoder 3 and then amplifies the analog sound signals.

The plug connection detecting unit 7 detects whether or not the connection plug 20A is connected to the connection jack 1A. For example, the plug connection detecting unit 7 determines whether or not the connection plug 20A is connected through whether or not a predetermined voltage is detected. This determination signal is transmitted to the control unit 6.

The power-supply voltage switching unit 2A switches power-supply voltages which have been supplied to the power amplifier 2. The details thereof will be described later.

The control unit 6 controls the sound signal data stored in the storage unit 5 to be read, and transmits the sound signals to the headphone device 20 using the decoder 3 and the power amplifier 2.

The control unit 6 reads sensitivity information from the nonvolatile memory 21 provided in the headphone device 20, switches states of the power-supply voltage switching unit 2A based on the sensitivity information, and controls switching of voltages supplied to the power amplifier 2 such that the sound signal has a predetermined sound pressure. Thereby, it is possible to perform reproduction in a predetermined limited sound pressure while maintaining the raw performance of the headphone device.

The connection switching unit 8 is provided in both the reproduction device 1 and the headphone device 20.

The connection switching unit 8 switches the L and R channels between a path through which sound signals flow and a path via which the control unit 6 communicates with the nonvolatile memory 21.

Figure 2:
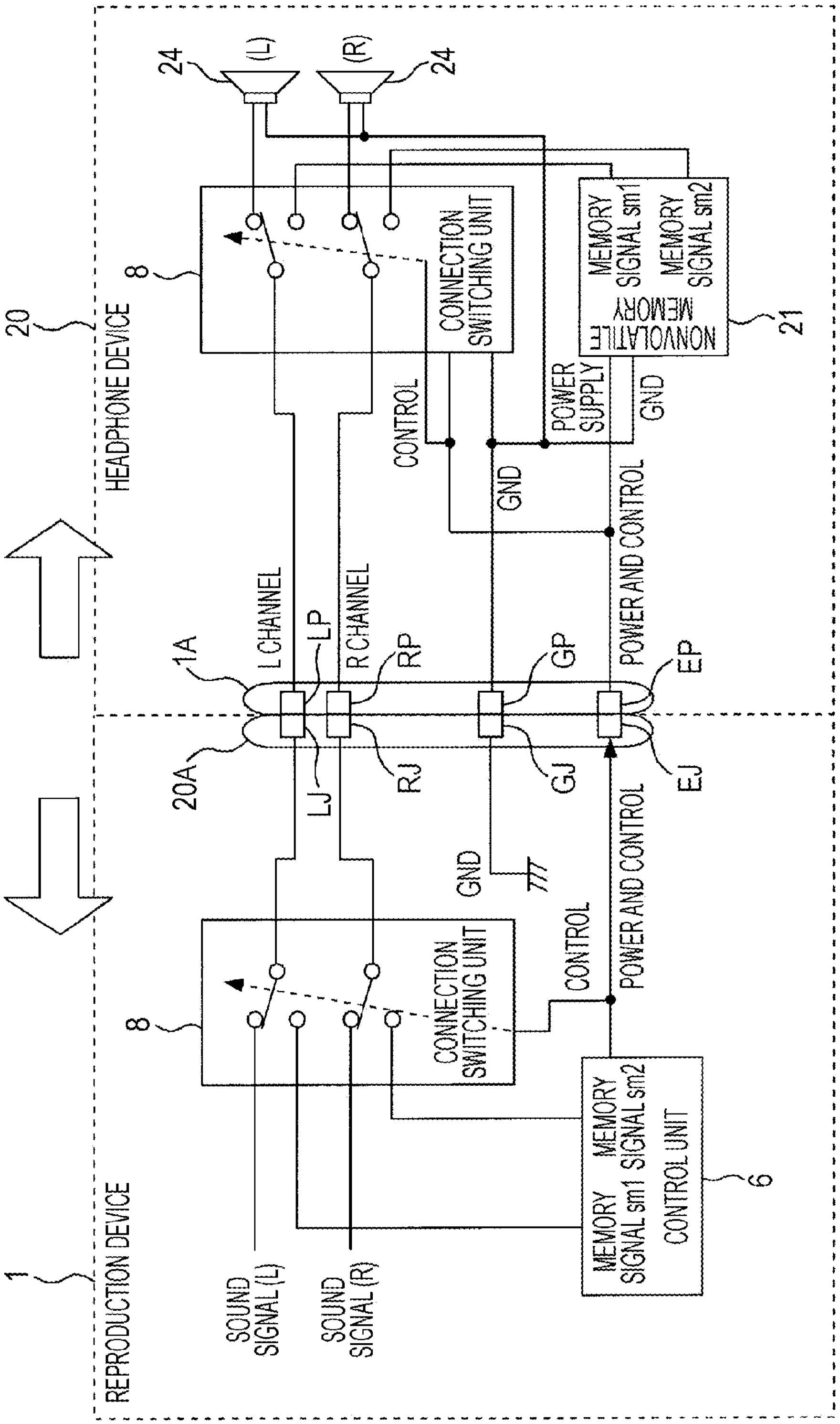
FIG. 2 is a diagram illustrating details of a connection switching unit according to the first embodiment.

FIG. 2 shows the details thereof.

As shown in the figure, each of the connection switching units 8 is a switch which is inserted into the L and R channel transmission paths.

The connection jack 1A and the connection plug 20A are respectively provided with L channel terminals LP and LJ, R channel terminals RP and RJ, and ground terminals GP and GJ. These are the same as the configuration terminals of the typical stereo type plug and jack. In addition thereto, power and control terminals EP and EJ are provided.

Typically, in each connection switching unit 8, the connection terminals are selected in a state as shown in the figure so as to form a transmission path of sound signals from the power amplifier 2 to the speaker 24.

When the headphone device 20 is connected to the reproduction device 1, the connection switching unit 8 can switch the connection terminals under the control of the control unit 6.

In other words, if detecting the connection of the connection jack 1A through the signal from the plug connection detecting unit 7 shown in FIG. 1, the control unit 6 outputs the power and control signal having a predetermined voltage level (H level).

When this power and control signal has the H level, each connection switching unit 8 switches the connection terminals to the connection state for communication with the memory.

The nonvolatile memory 21 enters a state where the power and control signal is supplied as an operation power-supply voltage. In addition, the ground line of the nonvolatile memory 21 is shared by the connection line according to the ground terminals GP and GJ.

When the power and control signal enters the H level and thus the connection terminals of the connection switching units 8 are switched, the L and R channel transmission paths connected by the L channel terminals LP and LJ and the R channel terminals RP and RJ are used to transmit and receive the memory signals sm1 and sm2 between the control unit 6 and the nonvolatile memory 21.

Thereby, the control unit 6 is connected to the nonvolatile memory 21 via the L and R channels and can read sensitivity information from the nonvolatile memory 21 through this connection.

After the completion of the reading, the control unit 6 makes the power and control enter the L level. Thereby, the connection switching units 8 switch the L and R channels to the path through which sound signals flow, and the headphone device 20 can reproduce the sound signals.

The above-described configuration means that the reproduction device 1 can use the connection jack 1A in the related art as it is. The control unit 6 can read the sensitivity information from the nonvolatile memory 21 without greatly changing the terminals or the shape of the connection jack 1A.

Figure 3:
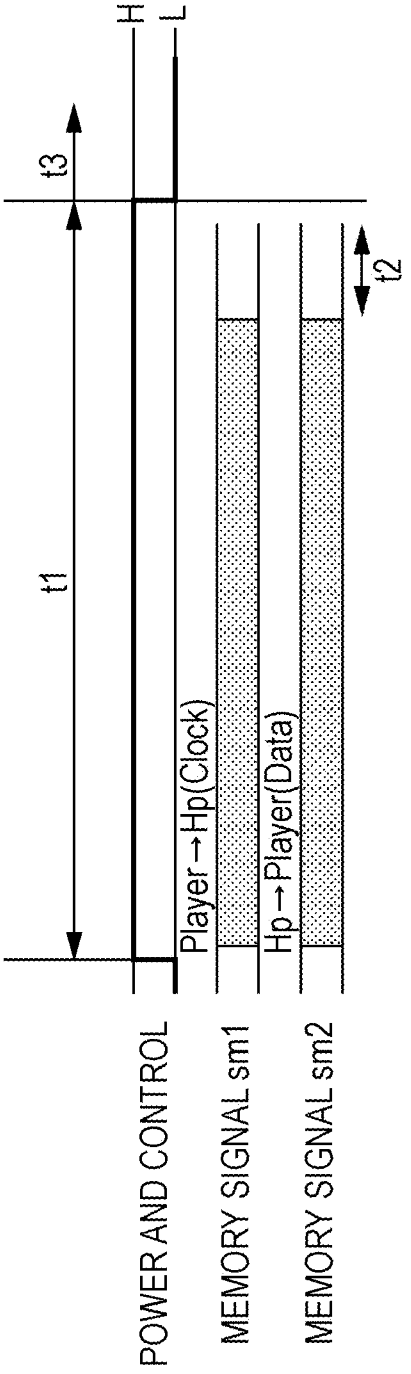
FIG. 3 is a diagram illustrating timings when the storage information is read from a nonvolatile memory according to the embodiment.

FIG. 3 shows timings when the control unit 6 reads the sensitivity information from the nonvolatile memory 21.

In FIG. 3, the power and control signal is a control signal for switching the states of the connection switching units and a power-supply voltage for the nonvolatile memory 21 as described above.

During the period t1, the power and control signal enters the H level, and the L and R channels are switched to the path for communication between the control unit 6 and the nonvolatile memory 21.

In this state, clocks are supplied to the nonvolatile memory 21 as the memory signal sm1 of the control unit 6. The sensitivity information is transmitted from the nonvolatile memory 21 to the control unit 6 as the memory signal sm2 in synchronization with the clocks.

Based on the sensitivity information, the control unit 6 switches the states of the power-supply voltage switching unit 2A and switches voltages supplied to the power amplifier 2 so as to have a predetermined sound pressure during the period t2. After the time point t3, the power and control signal enters the L level, and the L and R channels are switched to the path through which sound signals flow so as to transmit the sound signals.

Figure 4:
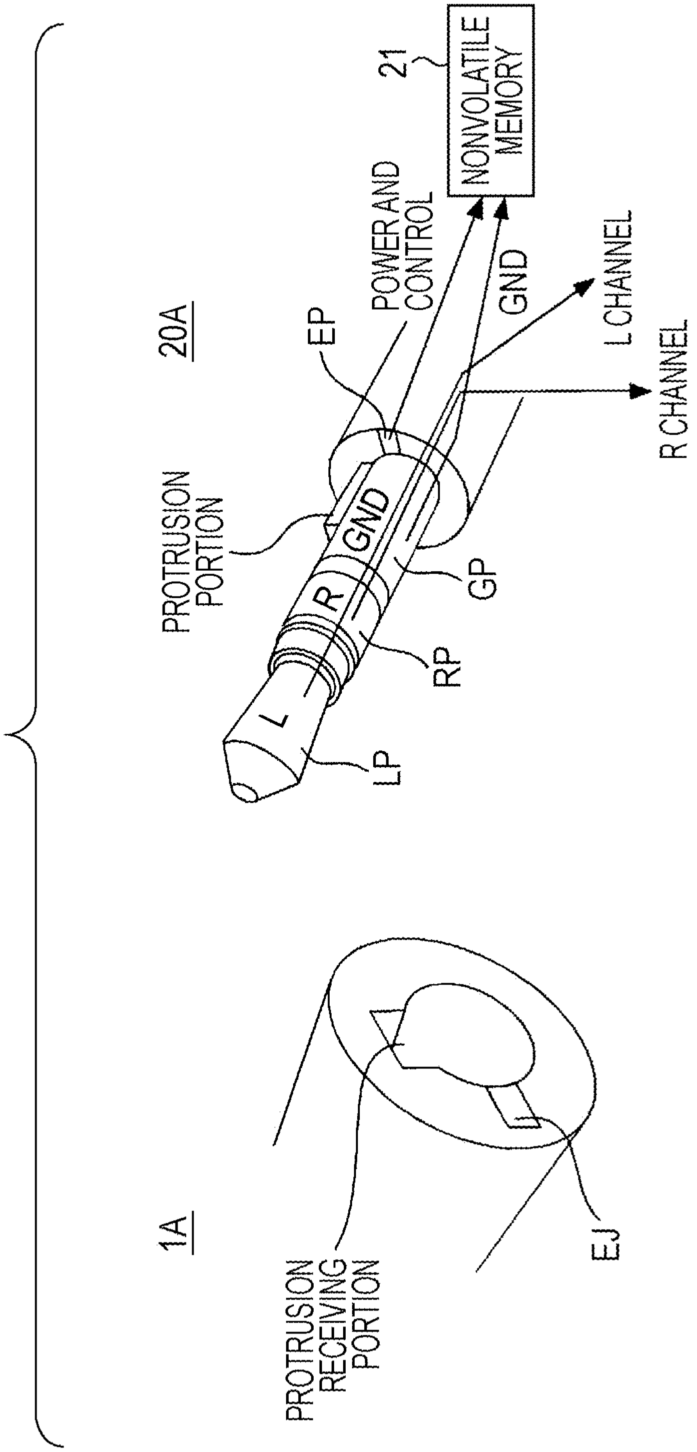
FIG. 4 is a diagram illustrating structures of a plug formed in the headphone device side and a jack formed in the reproduction device side according to the embodiment.

FIG. 4 shows a detailed example of terminal structures of the connection plug 20A and the connection jack 1A which make connection between the headphone device 20 and the reproduction device 1. The respective terminals are connected to each other through the coupling of the connection plug 20A and the connection jack 1A.

In FIG. 4, first, the connection plug 20A of the headphone device 20 is provided with the terminal LP for the L channel and the terminal RP for the R channel as the input terminals of sound signals supplied from the reproduction device 1, which has been described above. Also, a terminal EP for the power and control signal which is a signal used to switch states of the connection switching unit 8 is provided. The ground terminal GP which is commonly used for the L channel, the R channel and the power and control signal is also provided. The connection plug 20A is also provided with a protrusion portion for positioning.

At this time, the terminal LP, the terminal RP, and the terminal GP are formed so as to be arranged in a ring shape respectively independent from each other coaxially as shown in the figure. In contrast, the terminal EP for the power and control signal is provided to protrude from the part where the terminals LP, RP and GP are arranged coaxially.

On the other hand, the connection jack 1A of the audio player 1 side is provided with a protrusion receiving portion for positioning through the coupling with the protrusion portion. In other words, the connection jack 1A and the connection plug 20A are connected so as to have a predetermined positional relationship by the formation of the positioning portion.

Here, due to illustration using the drawing, although terminals for the L channel and the R channel, and a ground terminal which comes into contact with the ground terminal GP are not shown in the connection jack 1A side, these terminals are formed inside the connection jack 1A so as to come into contact with corresponding terminals provided in the connection plug 20A side one to one as shown in FIG. 2 when the connection plug 20A is connected.

Further, the terminal EJ for the power and control signal described above is formed in the connection plug 20A of the headphone device 20 side.

This terminal is positioned by the positioning portion, and when the connection plug 20A is connected to the connection jack 1A, the respective terminals are provided to come into contact with each other one to one according to the correspondence relationship of "EJ and EP".

By the structure of the connection plug 20A and the connection jack 1A as described with reference to FIG. 4, when the headphone device 20 is connected to the reproduction device 1, power can be supplied to the nonvolatile memory 21, and the control unit 6 can read information stored in the nonvolatile memory 21.

Also, audio signals can be supplied from the reproduction device 1 to the headphone device 20.

FIGS. 5A to 5D show details of the power-supply voltage switching unit 2A of the power amplifier 2. As the power amplifier 2, a case of an analog amplifier and a case of a digital amplifier are shown.

Figure 5A:
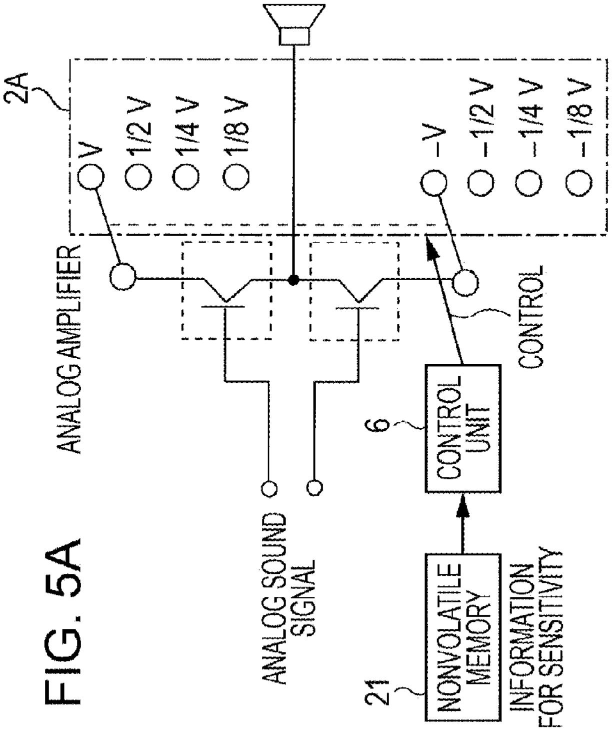
FIGS. 5A to 5D are diagrams illustrating details of power switching in a power amplifier according to the embodiment.

FIG. 5A shows a case of the analog amplifier. In FIG. 5A, an analog sound signal is supplied to the analog amplifier, and is amplified to a predetermined sound signal so as to be output. The analog sound signal is a signal into which a signal output from the decoder 3 is converted by a D/A converter (not shown).

Here, it is necessary to supply a voltage such that the power amplifier 2 itself works. At this time, in order to output, for example, a sinusoidal wave of 5 V, it is necessary to supply a voltage of at least 14 V ($5\times\sqrt{2}\times2$). Therefore, in the case of FIG. 5A, it is necessary to supply a voltage of −7 V to 7 V.

If the values of the voltage can be switched, it is preferable that a voltage of the necessary magnitude fit for the sound output can be supplied, and a voltage is not consumed wastefully.

In FIG. 5A, the supplied voltages (a positive voltage and a negative voltage) can be switched to one time, ½ time, ¼ time, and ⅛ time.

This switching is performed by a control signal from the control unit 6. That is to say, the control unit 6 reads the sensitivity information from the nonvolatile memory 21 of the headphone device 20, and the control unit 6 switches voltages to be supplied to the analog amplifier by the control signal based on the sensitivity information.

For example, in a case where 100 dB is stored in the nonvolatile memory 21 as the sensitivity information and the sound pressure limitation value is 85 dB, a voltage output from the analog amplifier becomes 0.126 Vrms (=−18 dBV) at the sensitivity 100 dB. Since the sound pressure limitation value relative to this value is 85 dB, for the voltage output from the analog amplifier, a dBV value becomes −18−15=−33 dBV, an effective value becomes 22.4 Vrms, and a peak value becomes 31.7 mV.

Figure 5B:
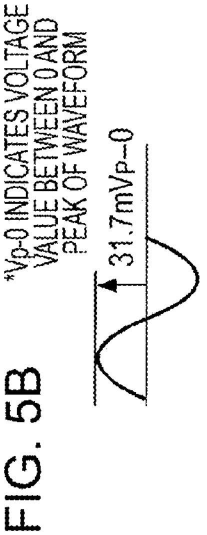

Therefore, if the sensitivity 100 dB of the headphone device is grasped, an output from the analog amplifier does not exceed 31.7 mV in one side. This is shown in FIG. 5B.

Through the calculation of the peak value of 31.7 mV, for example, when the supplied voltage is 0.5 V, the headphone device can sufficiently work at the supplied voltage of 62.5 mV which is ⅛ of the voltage. In other words, it is possible to suppress power consumption caused by a wasted voltage supply, to limit the sound pressure without employing the method where a resistor is added in series to a sound reproduction path, and to prevent deterioration in the sound quality or variation in the frequency characteristic.

Figure 5C:
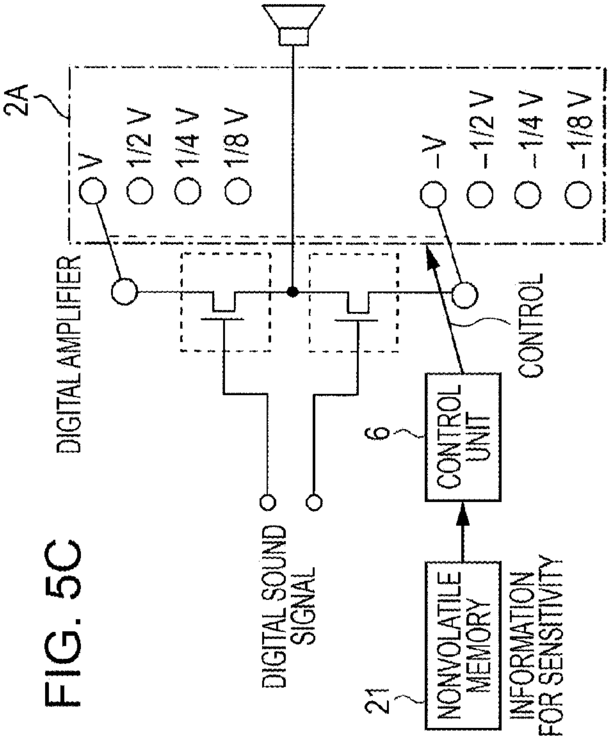

FIG. 5C shows a case of a digital amplifier. In FIG. 5C, a digital sound output from the decoder 3 is supplied to the digital amplifier and is amplified to a predetermined sound signal so as to be output. The signal output from the power amplifier 2 is a digital signal, and thus the signal is converted by a D/A converter (not shown) and is supplied to the headphone device 20 as an analog signal.

Figure 5D:
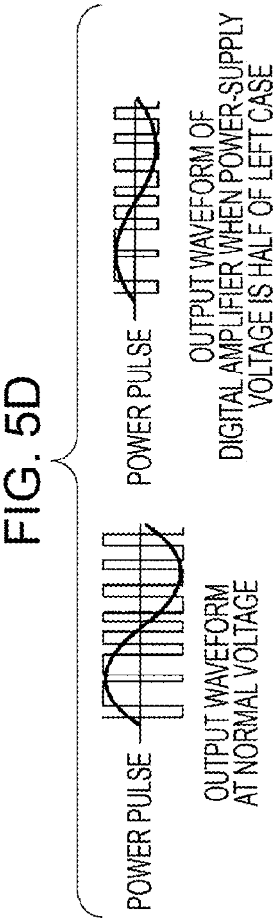

The switching of the supplied voltages is performed in the same manner as the case of the analog amplifier. FIG. 5D shows output waveforms from the digital amplifier in cases where the supplied voltage is not switched and the supplied voltage is switched to ½ time.

Figure 6:
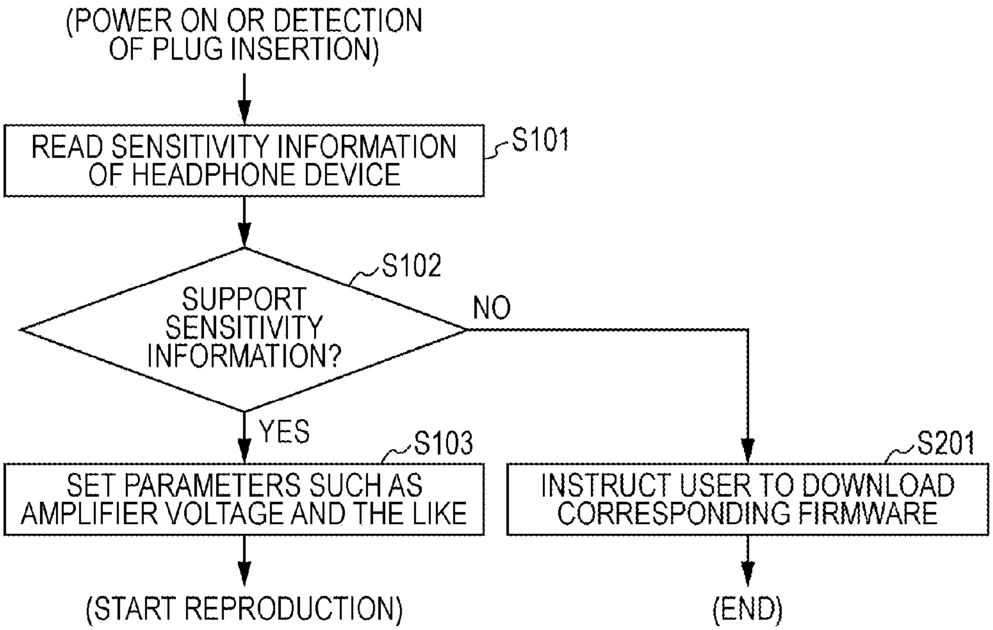
FIG. 6 is a flowchart illustrating processes to be performed according to the first embodiment.

FIG. 6 is a flowchart illustrating a process operation to be performed in order to realize the setting (changing) operation as the first embodiment described above.

In addition, the process operation in FIG. 6 is performed by the control unit 6 based on a program stored in, for example, a ROM.

To begin with, the control unit 6 detects the power-on or insertion of the plug. The control unit 6 performs a stand-by process till the plug is inserted. If the control unit 6 detects the power-on or the insertion of the plug, the control unit 6 performs a process in step S101.

In step S101, the control unit 6 reads sensitivity information from the nonvolatile memory 21 provided in the headphone device. For example, the reading by the operation described in FIG. 3 is performed. If the control unit 6 reads the sensitivity information, the control unit 6 performs a process in step S102.

In step S102, the control unit 6 determines whether or not to support the sensitivity information. If the sensitivity information is not supported, it may be a case of an unsupported model at that time, for example, such as a newly launched product. In this case, the flow goes to step S201, where control unit 6 performs a process in regard to the unsupported case. For example, a warning is emitted to a user, an instruction for downloading firmware is displayed on a display portion (not shown), or the like.

In the determination process in step S102, if the sensitivity information can be supported, the flow goes to step S103, and the control unit 6 switches the supplied voltage to ½ thereof or ¼ thereof. In other words, the control unit 6 sets the switching of the power-supply voltages in the power amplifier 2, described in FIG. 5.

The control unit 6 controls the power-supply voltage in the power amplifier 2 such that a sound signal supplied to the headphone device 20 lies in an allowable maximal output level based on the sensitivity information.

In the cases of the second to fifth embodiments described later, the process in step S103 corresponds to an adjustment of a gain unit, an adjustment of a limiter unit, an adjustment of an equalizer unit, or an adjustment of a compressor unit, or an adjustment of all the four units.

Thereafter, the control unit 6 performs a reproduction control. In other words, the control unit 6 controls the reading of data such as music content from the storage unit 5, and supplies the read sound data to the headphone device 20 via the decoder 3 and the power amplifier 2.

According to the first embodiment described above, it is possible for the device side to perform the automatic identification for each headphone device 20 which is used without a user's operation. Along therewith, it is possible for the reproduction device side to automatically set appropriate sensitivity according to the headphone device 20 to be used.

In this way, it is possible to automatically set sensitivity according to the headphone device 20 which is used, to suppress power consumption, to deliver raw performance of the headphone device, and to perform the reproduction in a predetermined sound pressure while maintaining raw sound quality.

For example, as described above, if a voltage supplied to the power amplifier is 0.5 V and a maximal voltage (a zero peak voltage) corresponding to a limited sound pressure is 31.7 mV, it is possible to supply a voltage of 62.5 mV which is ⅛ thereof instead of supplying the voltage of 0.5 V. It is possible to eliminate the inefficiency where heat energy is generated due to the addition of a resistor.

Second Embodiment

A second embodiment will be described.

In the first embodiment described above, sensitivity information unique to each of the types of the headphone devices 20 is maintained in the nonvolatile memory 21 of the headphone device 20, the reproduction device 1 reads the sensitivity information, and the power-supply voltages in the power amplifier 2 are switched based on the value, thereby limiting the sound pressure. In other words, the adjustment for putting a sound signal supplied to the headphone device 20 within an allowable maximal output level is an example performed in the form of the adjustment of the power-supply voltage in the power amplifier 2.

The parts which perform the adjustment for putting a sound signal supplied to the headphone device 20 within an allowable maximal output level may be diversified. The second to fifth embodiments are examples for functioning parts other than the power amplifier 2 as an adjustment unit of an output sound pressure.

Figure 9:
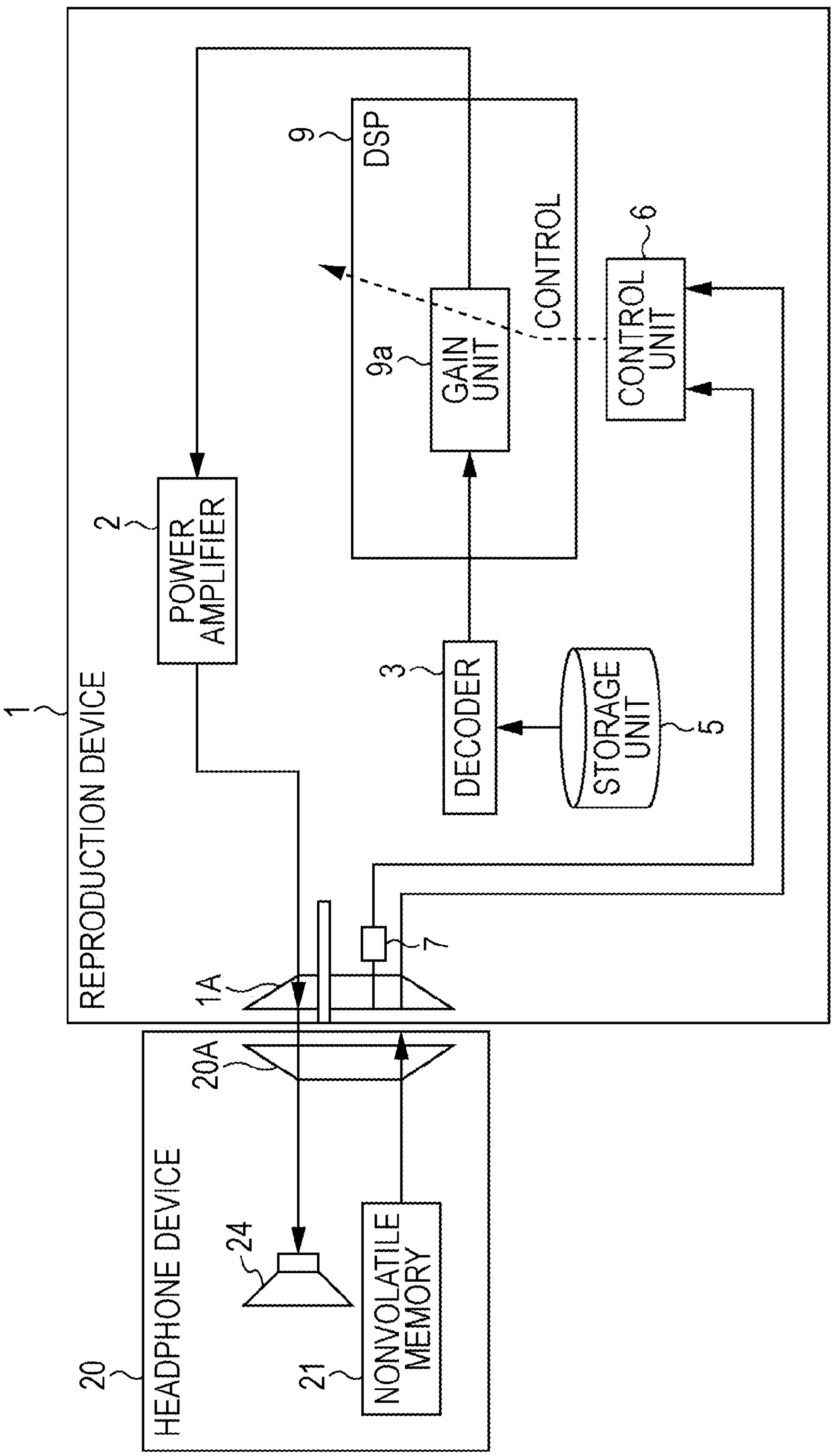
FIG. 9 is a block diagram illustrating a second embodiment.

FIG. 9 is a block diagram illustrating a second embodiment. In the following description, the parts which are the same as described above are given the same reference numerals and the description thereof will be omitted.

Here, a signal input to the power amplifier is limited to the sound pressure of a sound by adjusting a gain unit 9*a* based on sensitivity information from the nonvolatile memory 21.

A sound signal output from the decoder 3 is given a predetermined gain in the gain unit 9*a* and then is supplied to the power amplifier 2.

The gain unit 9*a* is adjusted by the control unit 6 using the control signal. The gain unit 9*a* is implemented by, for example, a DSP (Digital Signal Processor) 9. The DSP 9 performs various kinds of digital signal processes using a program (not shown).

With reference to FIG. 6, a process operation to be performed in order to realize a setting (changing) operation as the second embodiment will be described.

The processes in steps S101, S102, and S5201 are the same as in the first embodiment.

In the determination process in step S102, if the sensitivity information can be supported, the flow goes to step S103, and the control unit 6 adjusts the gain unit 9*a* based on the sensitivity information. A value of the gain which is adjusted is such a value that a sound signal supplied to the headphone device 20 lies in an allowable maximal output level.

Thereafter, the control unit 6 performs a reproduction control. Thereby, it is possible to limit the sound pressure while maintaining raw sound quality.

Third Embodiment

A third embodiment will be described.

Figure 10:
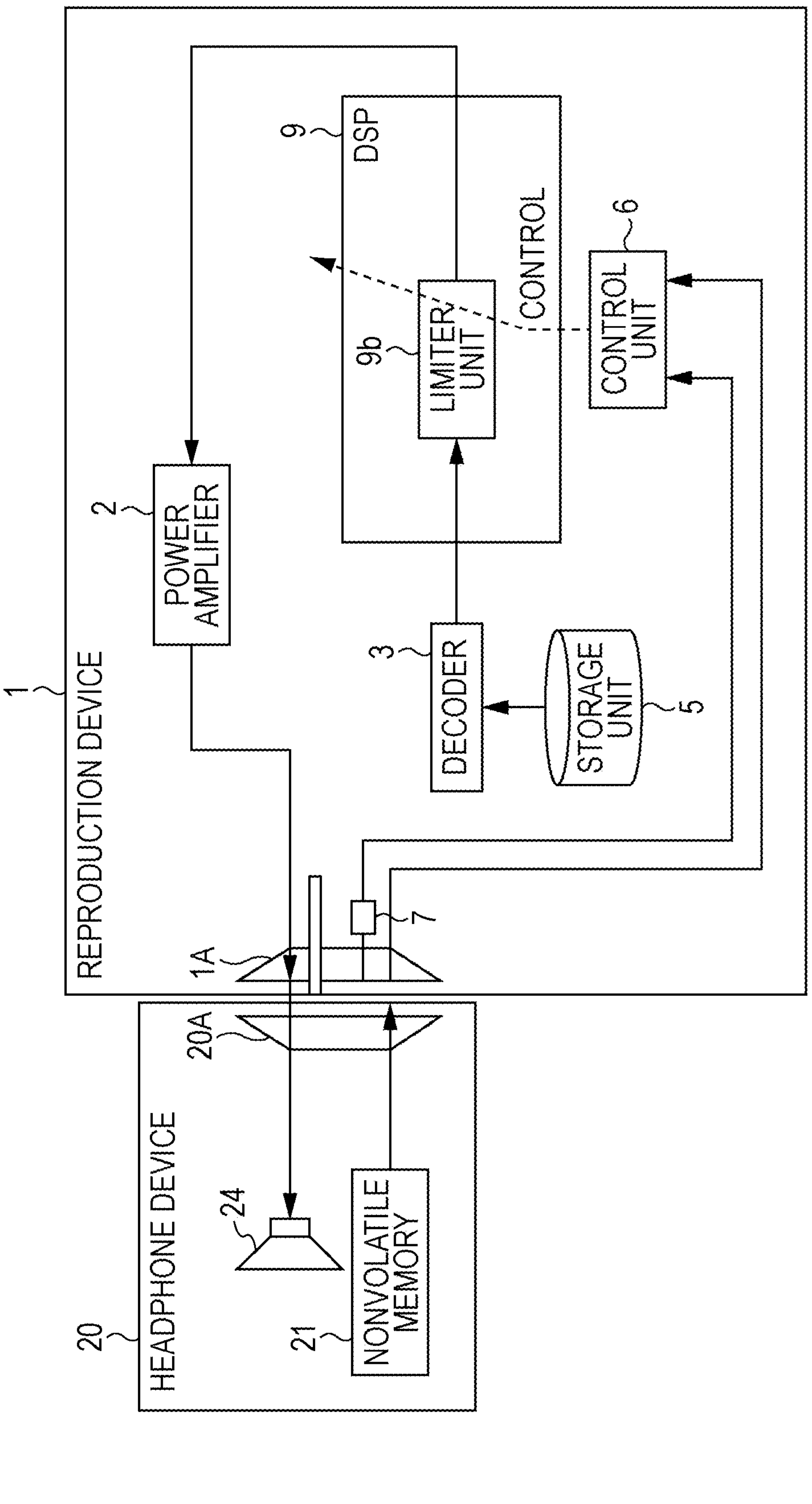
FIG. 10 is a block diagram illustrating a third embodiment.

FIG. 10 shows the third embodiment. In the following description, the parts which are the same as described above are given the same reference numerals and the description thereof will be omitted.

Here, a signal input to the power amplifier is limited to the sound pressure of a sound by adjusting a limiter unit 9*b* based on sensitivity information from the nonvolatile memory 21. A function of the limiter unit 9*b* is realized by the DSP 9.

In this case, a sound signal output from the decoder 3 undergoes a limiter process at a predetermined limit level in the limiter unit 9*b* and then is supplied to the power amplifier 2. The limit level in the limiter unit 9*b* is adjusted by the control unit 6 using the control signal.

With reference to FIG. 6, a process operation to be performed in order to realize a setting (changing) operation as the third embodiment will be described.

The processes in steps S101, S102, and S201 are the same as in the first embodiment.

In the determination process in step S102, if the sensitivity information can be supported, the flow goes to step S103, and the control unit 6 adjusts the limit level in the limiter unit 9*b*. A value of the limit level which is adjusted is such a value that a sound signal supplied to the headphone device 20 lies within an allowable maximal output level.

Thereafter, the control unit 6 performs a reproduction control. Thereby, it is possible to limit the sound pressure while maintaining raw sound quality.

Fourth Embodiment

A fourth embodiment will be described.

Figure 11:
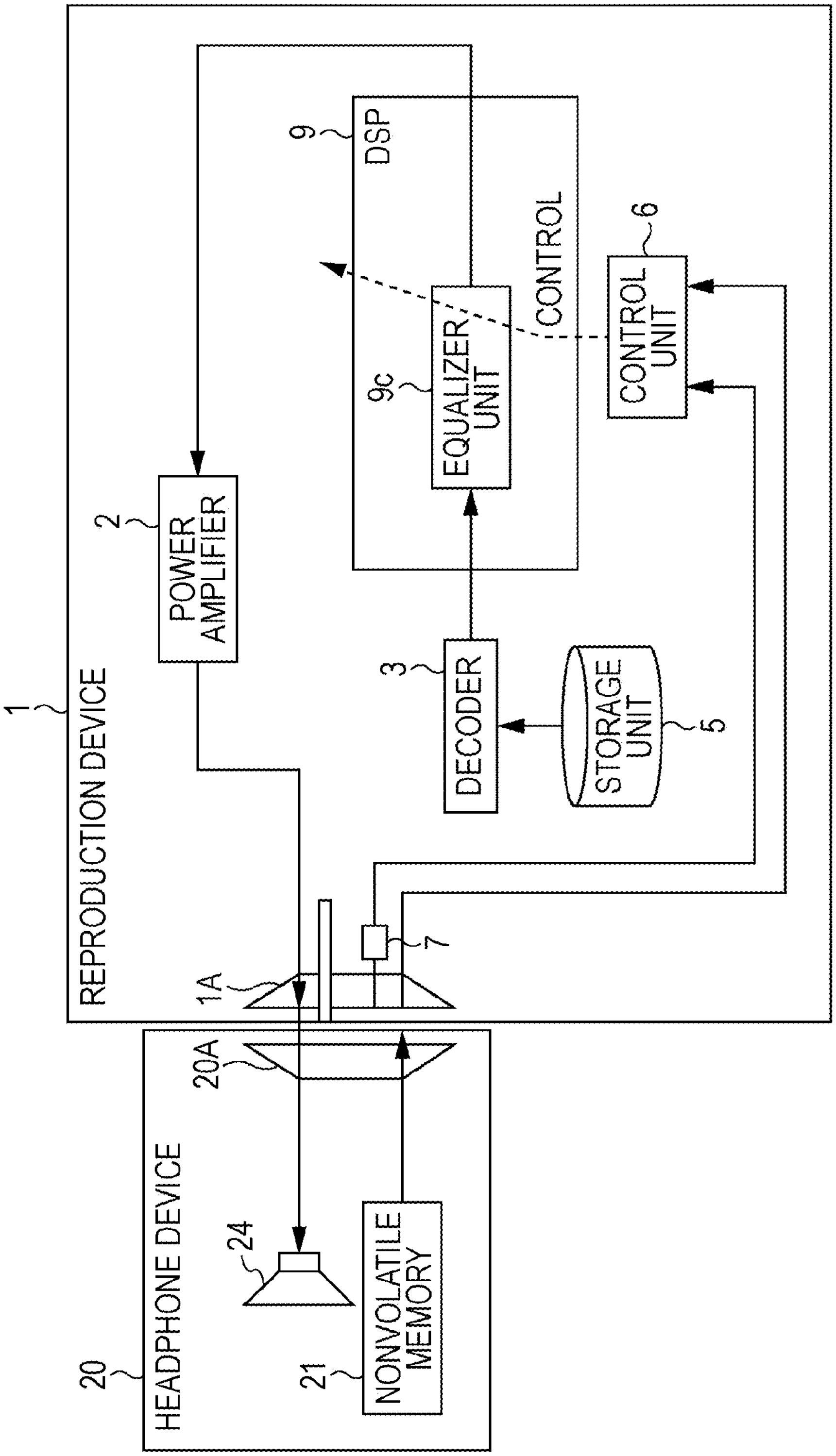
FIG. 11 is a block diagram illustrating a fourth embodiment.

FIG. 11 is a block diagram illustrating a fourth embodiment. The parts which are the same as described above are given the same reference numerals and the description thereof will be omitted.

Here, the frequency characteristic of a signal input to the power amplifier are varied and the signal is limited to the sound pressure of a sound by adjusting an equalizer unit 9*c* based on sensitivity information from the nonvolatile memory 21.

A function of the equalizer unit 9*c* is realized by the DSP 9.

In this case, a sound signal output from the decoder 3 undergoes a frequency characteristic adjustment in the equalizer unit 9*c* and then is supplied to the power amplifier 2. The adjustment of the frequency characteristic in the equalizer unit 9*c* is performed by the control unit 6 using the control signal.

With reference to FIG. 6, a process operation to be performed in order to realize a setting (changing) operation as the fourth embodiment will be described.

The processes in steps S101, S102, and S201 are the same as in the first embodiment.

In the determination process in step S102, if the sensitivity information can be supported, the flow goes to step S103, and the control unit 6 adjusts the equalizer unit 9*c*. A frequency characteristic which is selected is such a characteristic that a sound signal supplied to the headphone device 20 lies in an allowable maximal output level.

Thereafter, the control unit 6 performs a reproduction control. Thereby, it is possible to limit the sound pressure while maintaining raw sound quality.

Fifth Embodiment

A fifth embodiment will be described.

In the second to fourth embodiments described above, sensitivity information unique to each of predetermined types of the headphone devices 20 is maintained in the nonvolatile memory 21 of the headphone device 20, the reproduction device 1 reads the sensitivity information, and the gain unit 9*a*, the limiter unit 9*b*, and the equalizer unit 9*c* are adjusted independently from each other with respect to a signal input to the power amplifier based on the value.

In a fifth embodiment, an example where the control unit 6 controls a plurality of parts will be described.

Figure 12:
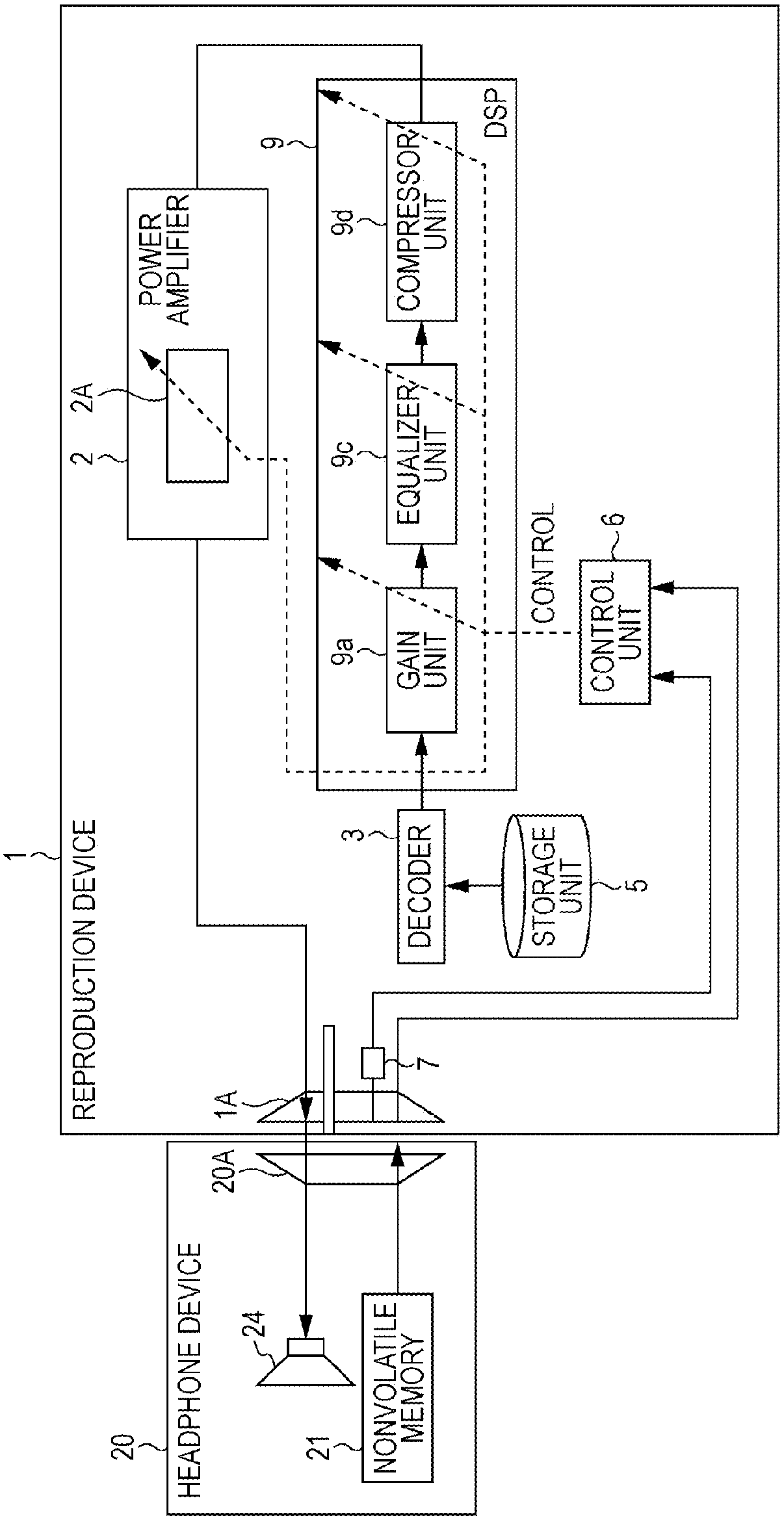
FIG. 12 is a block diagram illustrating a fifth embodiment.

FIG. 12 is a block diagram illustrating a fifth embodiment. The parts which are the same as described above are given the same reference numerals and the description thereof will be omitted.

Here, a signal input to the power amplifier is limited to the sound pressure of a sound by adjusting the gain unit 9*a*, the equalizer unit 9*c*, and a compressor unit 9*d*, and by adjusting a voltage supplied to the power amplifier 2 using the power-supply voltage switching unit 2A, based on sensitivity information from the nonvolatile memory 21, collectively.

Functions of the gain unit 9*a*, the equalizer unit 9*c*, and the compressor unit 9*d* are realized by the DSP 9.

In this case, a sound signal output from the decoder 3 is given a predetermined gain in the gain unit 9*a*, undergoes an adjustment of frequency characteristic in the equalizer unit 9*c*, undergoes compression in the compressor unit 9*d*, and then is supplied to the power amplifier 2.

The adjustments of the gain value in the gain unit 9*a*, the frequency characteristic in the equalizer unit 9*c*, and the compressor unit 9*d*, and the switching control in the power-supply voltage switching unit 2A are performed by the control unit 6 using the control signal.

Here, when the compressor unit 9*d* is included in the system, without exceeding the sound pressure limitation value, a loud sound is processed as it is, and a dynamic range of only a small sound is intentionally reduced by a gain increasing mechanism, thereby producing a "sense of volume". Since the impression is changed by a time constant such as attack or release at this time, it may be set by calculating an optimal value from the headphone sensitivity information or by using preset table values.

With reference to FIG. 6, a process operation to be performed in order to realize a setting (changing) operation as the fifth embodiment will be described.

The processes in steps S101, S102, and S201 are the same as in the first embodiment.

In the determination process in step S102, if the sensitivity information can be supported, the flow goes to step S103, and the control unit 6 collectively performs adjustments of the gain unit 9*a*, the equalizer unit 9*c*, and the compressor unit 9*d*, and the switching control of voltages supplied to the power amplifier 2, based on the sensitivity information. In other words, as a result of controlling the respective units, a sound signal supplied to the headphone device 20 has a value lying in an allowable maximal output level.

Thereafter, the control unit 6 performs a reproduction control. Thereby, it is possible to limit the sound pressure while maintaining raw sound quality.

Here, although the control unit 6 collectively controls the four units, three or two units of the gain unit 9*a*, the equalizer unit 9*c*, the compressor unit 9*d*, and the power-supply voltage switching unit 2A may be controlled.

Further, by controlling only the compressor unit 9*d*, a sound signal supplied to the headphone device 20 may lie in an allowable maximal output level.

Sixth Embodiment

A sixth embodiment will be described.

In the first embodiment described above, although the reading of unique sensitivity information stored in the nonvolatile memory 21 of the headphone device 20 by the reproduction device 1 is performed via the terminals coupled by the connection of the connection plug 20A and the connection jack 1A, other methods may be used.

In the sixth embodiment, an example where the control unit 6 reads sensitivity information through wireless communication will be described.

Figure 13:
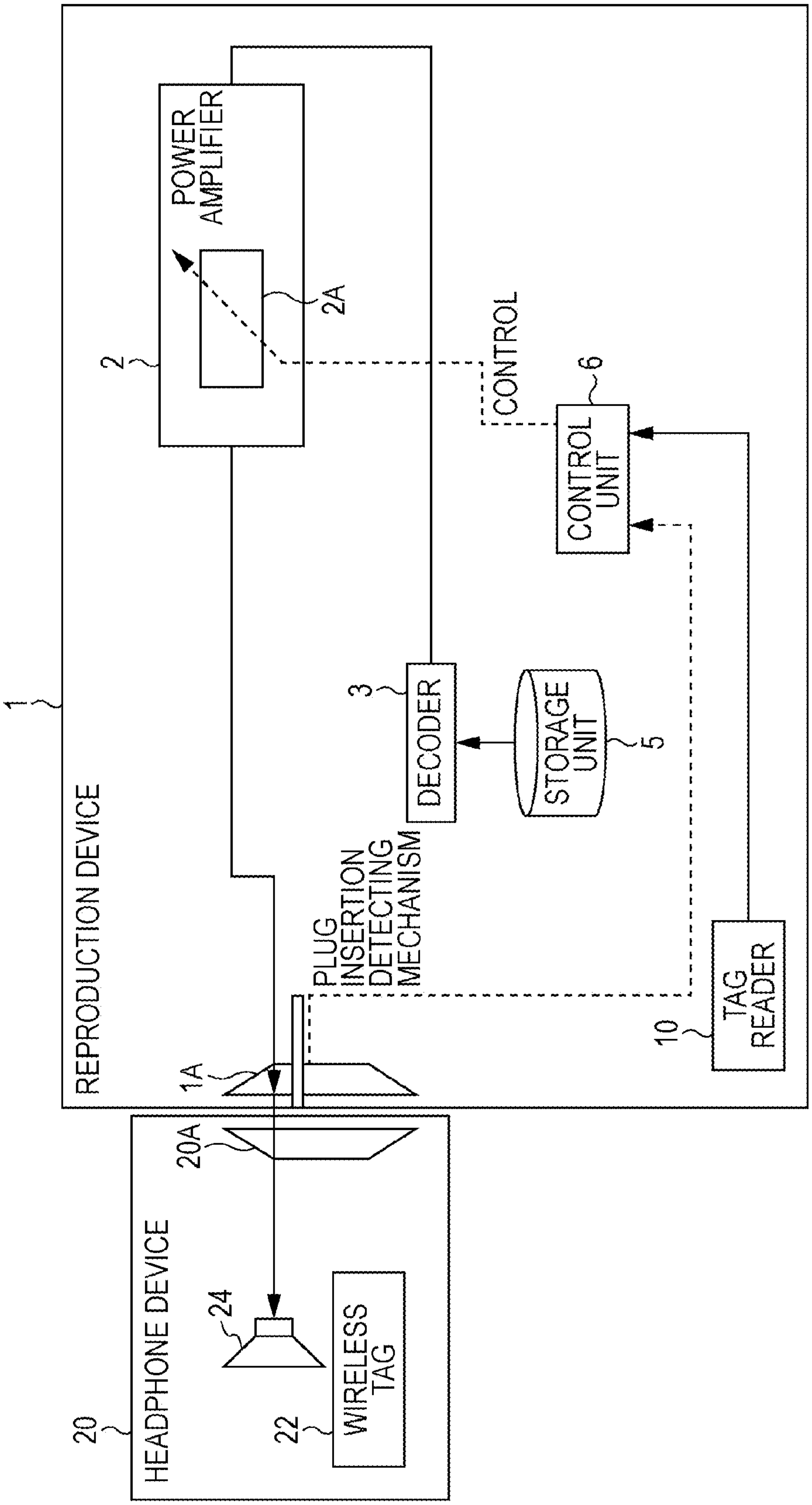
FIG. 13 is a block diagram illustrating a sixth embodiment.

FIG. 13 shows the sixth embodiment. The parts which are the same as described above are given the same reference numerals and the description thereof will be omitted.

The headphone device 20 side is provided with a wireless tag 22. Sensitivity information is stored in the wireless tag 22.

The reproduction device 1 is provided with a tag reader 10. The sensitivity information is read from the wireless tag 22 by the tag reader 10. In other words, when the headphone device 20 is connected to the reproduction device 1, the tag reader 10 accesses the wireless tag 22 by near field communication and reads the stored sensitivity information. The tag reader 10 transmits the read sensitivity information to the control unit 6. The control unit 6 performs the control operations which are the same as in the first to fifth embodiments.

Figure 14:
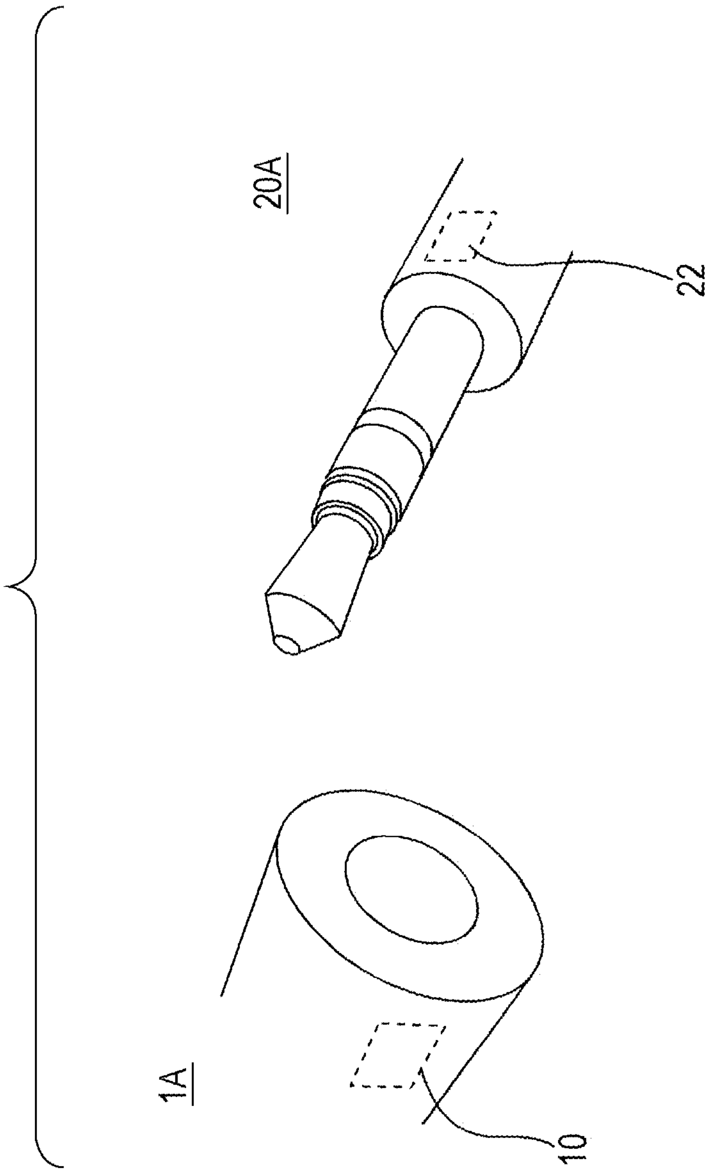
FIG. 14 is a diagram illustrating structures of a plug formed in a headphone device side and a jack formed in a reproduction device side in a case where a wireless tag and a tag reader are provided according to the embodiment.

FIG. 14 shows a structure example of the connection jack 1A provided in the reproduction device 1 and the connection plug 20A provided in the headphone device 20 side according to the sixth embodiment.

As shown in the figure, the wireless tag 22 is provided inside the connection plug 20A of the headphone device in this case.

In addition, the tag reader 10 for reading information stored in the wireless tag 22 by wireless communication (noncontact) is provided in the connection jack 1A of the reproduction device 1.

In this case, the wireless tag 22 may use a so-called passive type, and transmits data stored in a memory device when power is supplied by the tag reader 10 radiating an electric wave. The tag reader 10 reads the data transmitted from the wireless tag 22 according to the radiation of the electric wave.

Here, the wireless tag 22 and the tag reader 10 are provided so as to have a positional relationship which converges within a communicationable range at least when the connection plug is connected to the connection jack.

Also, in this case, the data communication line and the line for supplying power are not necessary when information stored in the headphone device 20 side is read, and thus the power and control terminals of the connection jack 1A and the connection plug 20A, which are provided in the case of the above-described first embodiment, can be omitted.

A process operation to be performed in order to realize a setting (changing) operation shown in FIG. 6 as the sixth embodiment is the same as in the first to fifth embodiments.

The present disclosure contains subject matter related to that disclosed in Japanese Priority Patent Application JP 2010-136341 filed in the Japan Patent Office on Jun. 15, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A reproduction device comprising: an information reading unit that reads sensitivity information from a storage unit of a headphone device, wherein the headphone device comprises a speaker configured to reproduce an electric signal of an audible signal, wherein the storage unit stores the sensitivity information for the speaker; an adjustment unit that adjusts an output level of the electric signal supplied to the headphone device; and a control unit that reads the sensitivity information from the storage unit via the information reading unit, and controls the adjustment unit such that the electric signal lies in an allowable maximal output level based on the sensitivity information; and perform connection switching for switching a connection state of a left (L) channel and a right (R) channel of the reproduction device between a first state and a second state, wherein the first state corresponds to a connection of the control unit with the storage unit of the headphone device and the second state corresponds to a supply of the electric signal of the audible signal to the headphone device.

2. The reproduction device according to claim 1, wherein the adjustment unit includes a power amplifier that is a stage which outputs the electric signal to the headphone device; and a voltage switching unit that switches voltages supplied to the power amplifier, and wherein the control unit controls the voltage switching unit to switch the supplied voltages based on the sensitivity information.

3. The reproduction device according to claim 2, wherein the information reading unit includes an (L) channel terminal, an (R) channel terminal, a ground terminal, and a power and control terminal as a connection unit with the headphone device; and wherein the control unit can communicate with the storage unit via the L channel terminal and the R channel terminal by switching the terminal states of the connection switching unit.

4. The reproduction device according to claim 1, wherein the adjustment unit includes an equalizer unit that processes the electric signal adjusts frequency characteristics of the electric signal, and wherein the control unit controls the equalizer unit such that the electric signal lies in an allowable maximal output level based on the sensitivity information.

5. The reproduction device according to claim 1, wherein the adjustment unit includes a gain unit that performs a gain process for the electric signal, and wherein the control unit controls the gain unit such that the electric signal lies in an allowable maximal output level based on the sensitivity information.

6. The reproduction device according to claim 1, wherein the adjustment unit includes a limiter unit that performs a limiter process for the electric signal, and wherein the control unit controls the limiter unit such that the electric signal lies in an allowable maximal output level based on the sensitivity information.

7. The reproduction device according to claim 1, wherein the adjustment unit includes a compressor unit that processes the electric signal, and wherein the control unit controls the compressor unit such that the electric signal lies in an allowable maximal output level based on the sensitivity information.

8. The reproduction device according to claim 1, wherein the storage unit of the headphone device can communicate wirelessly, and wherein the information reading unit wirelessly communicates with the storage unit.

9. The reproduction device according to claim 1, wherein the sensitivity information is information in an allowable range of sensitivity of the speaker.

10. A reproduction method comprising: reading sensitivity information from a storage unit of a headphone device which has, a speaker reproducing an electric signal of an audible signal as a sound and the storage unit storing the sensitivity information for the speaker; and adjusting an output level of the electric signal such that the electric signal supplied to the headphone device lies in an allowable maximal output level based on the sensitivity information; and perform connection switching for switching a connection state of a left (L) channel and a right (R) channel of the reproduction device between a first state and a second state, wherein the first state corresponds to a connection of the control unit with the storage unit of the headphone device and the second state corresponds to a supply of the electric signal of the audible signal to the headphone device.

11. The reproduction method according to claim 10, wherein the sensitivity information is stored in a wireless tag.

12. The reproduction method according to claim 11, further comprising communicating with the storage unit of the headphone device wirelessly using the wireless tag.

13. The reproduction device according to claim 1, wherein a gain unit, an equalizer unit, and a compressor unit, adjust a gain value, adjust frequency characteristic of and compress the electric signal respectively such that the electric signal lies in the allowable maximal output level based on the sensitivity information.

* * * * *